United States Patent [19]

Hadni

[11] 4,211,821
[45] Jul. 8, 1980

[54] MONOCRYSTALLINE LIKE LAYERS, PROCESSES OF MANUFACTURING SUCH LAYERS, AND ARTICLES COMPRISING SUCH LAYERS

[75] Inventor: Armand Hadni, Nancy, France

[73] Assignee: Agence Nationale de Valorisation de la Recherche (ANVAR), France

[21] Appl. No.: 806,103

[22] Filed: Jun. 13, 1977

[30] Foreign Application Priority Data

Jun. 14, 1976 [FR] France .................................. 76 17957

[51] Int. Cl.² .......................... B32B 9/04; B01J 17/00
[52] U.S. Cl. .................................... 428/411; 156/612;
156/621; 156/614; 156/622; 156/DIG. 88;
427/240
[58] Field of Search ........................ 428/411; 427/240;
156/612, 621, 614, 622, 416.88; 23/295 R, 300

[56] References Cited

U.S. PATENT DOCUMENTS

| | | | |
|---|---|---|---|
| 3,634,150 | 1/1972 | Horn | 156/612 |
| 3,650,822 | 3/1972 | Crabmaier | 156/622 |
| 3,853,596 | 12/1974 | Distler et al. | 156/612 |
| 3,922,467 | 11/1975 | Pinchon | 428/411 |
| 4,111,725 | 9/1978 | Cho et al. | 156/612 |

FOREIGN PATENT DOCUMENTS

| | | | |
|---|---|---|---|
| 1289831 | 2/1969 | Fed. Rep. of Germany | 156/612 |
| 2144881 | 2/1973 | France . | |
| 1423594 | 2/1976 | United Kingdom | 156/622 |

OTHER PUBLICATIONS

Distler et al., "Growth of Single Crystals Through Interfacial Layers", *Journal of Crystal Growth*, vol. 26, (1974), pp. 21–26.
Henry, "Ferroelectrics", Kirk-Othmer Ect., vol. 9, pp. 1-2, 4-5 & 25, ©1966.

Primary Examiner—William A. Powell
Assistant Examiner—J. J. Gallagher
Attorney, Agent, or Firm—Jacobi, Lilling & Siegel

[57] ABSTRACT

Thin monocrystalline like layers and articles comprising such layers as well as methods of making the layers and articles are disclosed. The layer have a thickness on the order of a micron and have a surface area on the order of 1 cm². The layers are made out of a given material and are grown on a layer made of a material different from the given material which rests on a crystal mass made of either the same material or of a material having the same or a related structure as the crystal to be grown.

12 Claims, 16 Drawing Figures

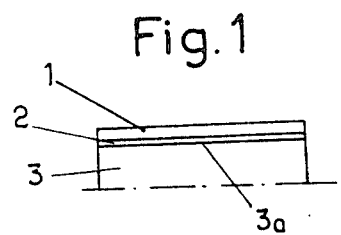
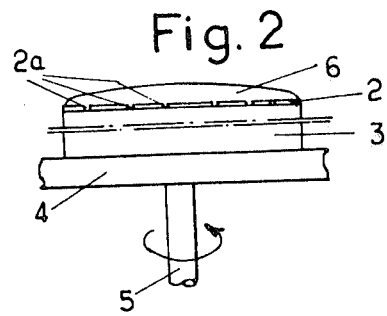
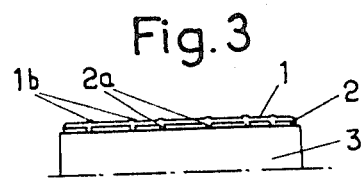
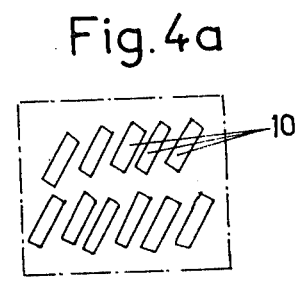
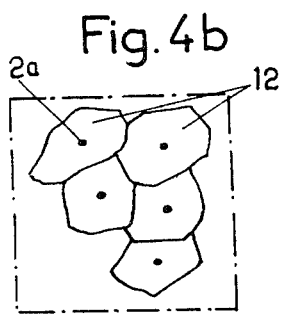
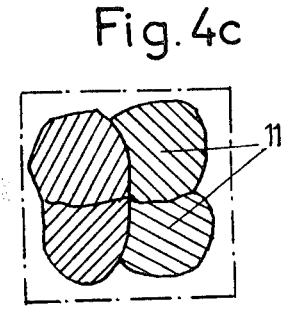
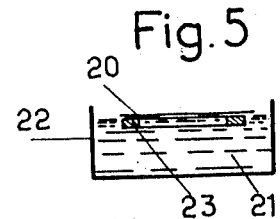
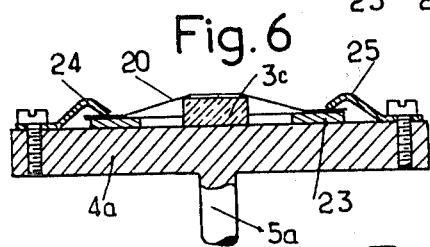
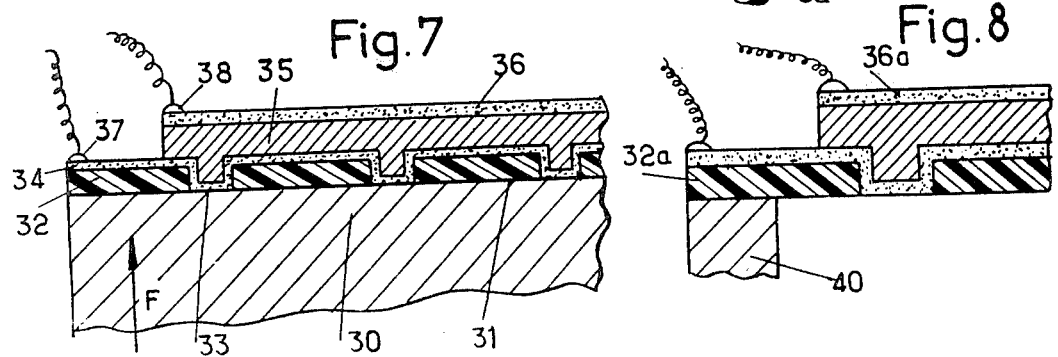
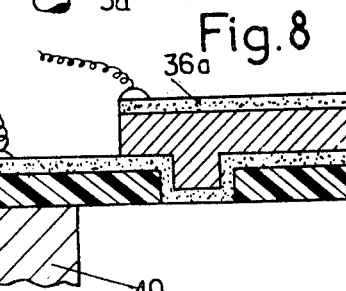

MONOCRYSTALLINE LIKE LAYERS, PROCESSES OF MANUFACTURING SUCH LAYERS, AND ARTICLES COMPRISING SUCH LAYERS

BACKGROUND OF THE INVENTION

1. Field of the Invention

The invention relates to monocrystalline layers, to the processes of fabricating such layers and to the structures comprising a monocrystalline layer. More particularly, it relates to a process for manufacturing monocrystalline layers which occur in the form of thin films whose thickness is on the order of a micron and which extend over a significant surface, on the order of 1 cm$^2$.

2. Description of the Prior Art

Thin monocrystalline layers have not been manufactured until the present except by the epitaxial process which consists of growing one such layer on the surface of an existing crystal of the same material as the said layer or of a material having a crystalline structure identical to or related to that of the layer to be grown. This process thus requires a special support. Furthermore, in general, the monocrystalline layer cannot be easily detached from the support.

In addition, it is practically impossible to fabricate thin monocrystalline films by polishing whose thickness is less than 5 microns for a surface on the order of a square centimeter.

French Pat. No. 2 144 881 as well as an article entitled "Growth of Single Crystals Through Interfacial Layers" appearing in the Journal of Crystal Growth, 26 (1974) 21–26 by Distler et al. both disclose a process of growing single crystals through interfacial layers. In effect a crystal seed is encased within an interfacial layer and a massive crystal is then grown around the seed. The purpose of both these processes is to produce a massive monocrystal having improved properties. However, the massive crystals produced cannot be easily separated from their seeds and their accompanying interfacial layers. Furthermore, because of their thickness these crystals are too large for a number of important applications where it would be advantageous to be able to arrange thin monocrystalline layers on a given support, which may, for example, be metallic or insulating.

SUMMARY OF THE INVENTION

The invention has as an object the fabrication of monocrystalline-like layers, specifically on a support of a given nature.

To fabricate a monocrystalline-like layer of a given material, according to the invention, one proceeds in the following fashion. On the face of a monocrystalline support which is made of the said given material, or of a material presenting the same structure or a related structure, one arranges an intermediate layer, preferably of low thickness, which is made of a second material, different from the given material. This layer is deposited on the said face of the monocrystalline support and has a thickness within predetermined limits. Finally, the monocrystalline layer of the said given material is grown on this intermediate layer.

It is important to note at this point that the second material, on which is fabricated the monocrystalline layer, can be of any type. Thus, this second material can be freely chosen as a function of the contemplated application of the layer. It has been observed, as will be explained further, that the monocrystalline-like layers can be fabricated on any given support as long as the process of the invention is used.

The invention has one of its objects a process in which one selects the intermediate layer, made of a second material so that it has openings of small cross-section distributed, for example, in a substantially regular fashion over the surface. It is moreover to be noted that the openings can be made in the said intermediate layer either prior to the manufacture of the monocrystalline-like layer and before or after this layer of the second material has been applied to the surface of the monocrystalline support, or by an appropriate choice of the thickness of this layer, in which case the layer may be created, for example, by evaporation under vacuum, directly on the surface of the monocrystalline support. However the openings are made, it is in general preferable that they have a diameter at most equal to about 6 microns and that the distance separating the adjoining openings be at most equal to about 600 microns.

The choice of the limits of the thickness of the layer made of the second material must be determined in each case by experimentation depending on the nature of the monocrystalline support, the nature of the second material and on the nature of the given material.

In the preferred embodiment of the invention, a monocrystalline-like layer is grown by depositing a solution, preferably saturated, of the said given material on the layer made of the second material. The solution is then distributed in a substantially uniform fashion, over the said layer made of a second material. In this case, to distribute the solution in a substantially uniform fashion, one confers a rotational movement around a vertical axis of the said monocrystalline support in a fashion such that the said surface rests substantially in a horizontal plane. In any event, in this case, it is advantageous that the support be at a temperature above the ambient temperature so as to accelerate the evaporation of the liquid in which the given material is dissolved.

The monocrystalline-like layers obtained by the process according to the invention have particular characteristics. These monocrystalline layers make up a part of the invention.

According to another aspect, the invention concerns also a structure having a monocrystalline-like layer fixed to a support which is equally monocrystalline. According to the invention, this structure is characterized in that it comprises an intermediate layer in contact with one surface of the said monocrystalline support. This intermediate layer is made out of a second material different from the material constituting the support and is of a low thickness. The monocrystalline-like layer is located on this intermediate layer and it is made out of a given material which has a crystalline structure which is the same as or is related to that of the support.

According to yet another aspect of the invention, it relates to a process of making a monocrystalline-like layer of a given material which is characterized in that, one deposits a layer made out of a second material different from the given material on a surface of a monocrystalline support made of the said given material or out of a material having the same crystalline structure or a related structure. The layer made out of the second material has openings of small cross-section distributed over its surface. On this layer, made out of a second material, and on the parts of the surface of the monocrystalline support which are aligned with the openings of small cross-section, one deposits a layer made out of a third material, different from the given material and from the second material. This layer, made out of a third material, has a thickness such that is comprises submicroscopic openings. Finally, the monocrystalline-like layer is grown on the said layer made out of a third material.

The invention relates equally to a structure obtained by the process and, in a general fashion, to a structure which comprises a thin monocrystalline layer connected to a support which is equally monocrystalline which is characterized in that it comprises a first intermediate layer in contact with a face of the monocrystalline support. This first intermediate layer is made out of a second material, different from the material constituting the support and has openings of small cross-section. A second intermediate layer, made out of a third material different from the material constituting the support as well as being different from the second material, is placed in contact with the first intermediate layer and with the parts of the monocrystalline support surface which are aligned with the openings of the first layer. This second intermediate layer is of small thickness; the thin monocrystalline layer is disposed on this second intermediate layer and is made of a given material which has a crystalline structure which is the same as or related to that of the support.

Other aims, characteristics and advantages of the invention will become clear from the description of certain of the embodiments, this description being made in reference to the attached drawings.

BRIEF DESCRIPTION OF THE DRAWINGS

FIG. 1 shows a structure according to the invention;

FIG. 2 illustrates a device for effecting the process according to the invention;

FIG. 3 shows, according to the invention, the structure obtained after effecting the process illustrated in FIG. 2;

FIGS. 4a, 4b and 4c are planar schematic views of layers obtained by different choices of the characteristics of the intermediate layer;

FIG. 5 shows a process according to the invention of manufacturing a collodion membrane constituting the layer, made out of the second material of the process and of the structure conforming to the invention;

FIG. 6 illustrates a device for effecting the process conforming to the invention when the layer made out of a second material is in the form of a thin plastic film;

FIG. 7 illustrates a pyroelectric detector according to the invention;

FIG. 8 illustrates a step of a process permitting the manufacture of a pyroelectric detector analogous to that shown in FIG. 7;

DETAILED DESCRIPTION OF THE INVENTION

Figure 9:
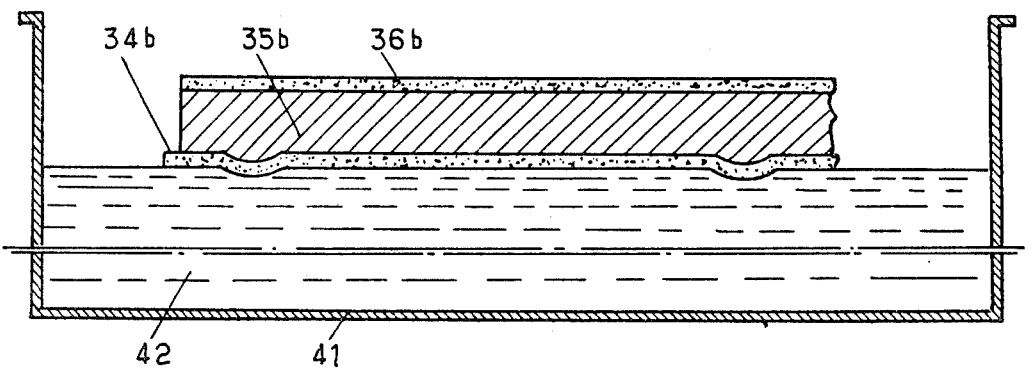
FIGS. 9, 10 and 11 illustrate steps of manufacturing processes, conforming to the invention, of pyroelectric detectors having thin monocrystalline layers of TGS.

As has been previously mentioned, the invention has specifically for an aim to permit the manufacture of thin monocrystalline-like layers, whose thickness is on the order of a micron and whose surface is relatively substantial: on the order of a square centimeter.

FIG. 1 illustrates a structure according to the invention which comprises one such monocrystalline layer 1. In this example, the layer 1 is made out of a ferroelectric material: triglycine sulfate (TGS).

Thin monocrystalline layer 1 is located on an intermediate layer 2 made out of silver. The metallic layer 2 is itself deposited on a support 3 which is made out of a crystal of the same type as the layer 1: a crystal of triglycine sulfate.

To manufacture the structure represented in FIG. 1 one proceeds in the following fashion. The surface 3a, on which the layer 2 must be deposited, is first polished. Then on this polished face is deposited, for example by evaporation under vacuum, the silver layer 2 whose thickness is controlled by measuring its resistance per unit of square surface.

In the course of experiments within the framework of the invention, it has been observed, surprisingly, that if a thin layer 1 of triglycine sulfate is deposited on the layer 2, thin layer 1 occurs in monocrystalline form over a relatively extended surface, on the order of a square centimeter. However, to obtain this result, it is necessary that the thickness of the layer 2 be between the controlled limits. In the example, the thickness of the metallic layer 2 had to be such that its resistance per square centimeter was between about 0.1 and about 1 ohm.

FIG. 2 illustrates a device and a method for use in the manufacture of the layer 1, after deposit of the layer 2 of silver. This process and apparatus are both known in and of themselves notably in view of the article of J. T. Jacobs and K. L. Keester published in the American review "Journal Of Vacuum Science And Technology", volume 10, No. 1, January/February 1973, pages 231 to 234 and entitled "Ferroelectric Properties Of Triglycine Sulphate Thin Films". However, it is important to note that the process described in this article only enables one to obtain layers of TGS which are polycrystalline.

As shown in FIG. 2, the crystal 3 covered by the metallic layer 2 is deposited on a horizontal support 4 connected to a rotating shaft 5 having a vertical axis.

To manufacture the layer 1, one deposits on the said metallic layer 2 a drop 6 of an aqueous saturated solution of triglycine sulfate at a temperature of approximately 55° C. The crystal 3 is heated to a temperature of approximately 65° C. by heating means of the thermostat type (not shown) and the shaft 5 is caused to rotate at a speed of approximately 5000 revolutions/minute. Under these conditions, one observes that at the end of a number of seconds a monocrystalline layer 1 of triglycine sulfate is formed (FIG. 3); this layer 1 is distributed in a uniform fashion, having a practically constant thickness, on the layer 2, by virtue of the rotation conferred upon crystal 3.

Without desiring to limit the invention to a particular explanation it is thought, however, that the origin of the surprising result—which consists in obtaining a monocrystalline-like layer on a support 2 having a significantly different structure—resides in the fact that the said layer 2 has a certain porosity. In other words, as shown in FIGS. 2 and 3, the layer 2 has openings 2a which are spaced in a substantially regular fashion over the surface of the layer 2. Under these conditions, when one deposits the drop 6 of the saturated triglycine sulfate solution on the surface of the said layer 2, this solution comes into contact with the surface 3a of crystal 3 across the openings 2a. Thus, the parts of the crystal 3 which are aligned with the openings 2a consitute seeds permitting the growing of the triglycine sulfate crystals. Moreover, the rotation around a vertical axis assures the uniform growth of the layer 1. In effect, in the absence of the said rotational movement one obtains, aligned with each hole or opening 2a, a monocrystalline layer. However, even though the separate crystals each have the same orientation, the monocrystalline layers correspond to each of the separate openings, i.e., they are not joined.

Otherwise expressed, the rotation assures a joining between the various monocrystals (in a thin layer) of the same orientation.

This hypothesis relative to the growth of the monocrystalline layer 1 has moreover been confirmed, in the above mentioned example, by study with a microscope using polarized light of the layers 1 and 2 and by study of the infrared spectrum of the TGS layer between about 1 and about 20 microns in polarized light which has shown a complete dichroism.

As shown in FIG. 3, the layer 1 obtained does not have a perfectly planar exterior surface because the swelling 1b appears at the openings 2a. Yet, these swellings, which are of reduced dimensions with respect to the thickness of the layer 1 are not a problem for the majority of anticipated applications of the monocrystalline layers.

It is to be noted that in order to facilitate the growth of the layer 1 it is preferable to add a wetting agent to the aqueous solution, preferably saturated, of triglycine sulfate.

To obtain a layer 1 of significant surface area the layer 2, as already mentioned hereinabove, must have a thickness between certain limits; limits which are determined, in general, in an empirical fashion. It has already been indicated that, in the example, the thickness of the silver layer 2 is chosen in a fashion such that the resistance per square centimeter be between about 0.1 and about 1 ohm.

It is thought that this condition of thickness equally confirms the hypothesis of the growth across the holes 2a, as will be seen below with respect to FIGS. 4a to 4c.

These FIGS. 4a, 4b and 4c illustrate the structure of the layers obtained when the thickness of the layer 2 varies. FIG. 4a represents the triglycine sulfate layer obtained when the layer 2 is too thin; FIG. 4b shows the monocrystalline layer 1 obtained where the resistance of the silver layer is between about 0.1 and about 1 ohm/cm$^2$; and FIG. 4c illustrates the triglycine sulfate layer obtained when the thickness of the layer 2 is too great.

As shown in FIG. 4a, if the thickness of the layer 2 is too small, one obtains a group of separate crystals 10 each having the same orientation. One does not thus obtain the uniform monocrystalline layer over a significant surface area.

As shown in FIG. 4c when the thickness of the layer 2 is too great, although one obtains a continuous layer of triglycine sulfate, this layer is formed of a group of crystals 11 having diverse orientations.

When the layer 2 satisfies the condition indicated above concerning the resistance per unit of square surface, one obtains a group of monocrystals 12 which are very thin, which each have the same orientation and which are joined. In other words, one obtains in fact a monocrystalline-like or quasimonocrystalline uniform layer 1. However, this layer has a particular and novel structure, because it is constituted by a group of flat monocrystals of the same orientation as the crystal 3 (forming a sort of a matrix) and which are attached in a continuous fashion one to the other. In the example, these crystals each have a width on the order of approximately 300 microns or greater.

It is thought that each crystal corresponds to a seed, i.e., an opening 2a in the layer 2, the number of such seeds per unit of surface, diminishing when the thickness of this layer 2 increases.

In the example, which has been described with relation to FIGS. 1 to 3, the intermediate layer 2 is constituted by a silver film. It has, however, been observed, in the course of the experiments conducted within the framework of the invention, that layer 2 could be of any nature. For example, the silver layer may be replaced by a layer of another metal, for example chromium. One could equally have made the said layer 2 out of an insulator such as calcium fluoride or lead fluoride of a thickness between about 2 and about 3 microns.

In these examples, the intermediate layer 2 is deposited by evaporation under vacuum; under these conditions, it is practically impossible to separate this layer 2 from crystal 3. On the contrary, in the examples which will now be described with relation to FIGS. 5 and 6, the said layer is not permanently attached to a large crystal but is simply applied to it to permit the manufacture of a flat monocrystal.

In these examples, the "intermediate" layer is constituted either by a collodion film whose thickness is on the order of 0.1 micron or by a film of a plastic material known under the mark "MYLAR" of a thickness of approximately 4 microns.

FIG. 5 illustrates a process of making a collodion film or membrane before it is applied against the face of the crystal 3c (FIG. 6) made out of triglycine sulfate. The monocrystalline layer, equally made of triglycine sulfate, will subsequently be disposed on this film.

To manufacture the collodion film 20 (FIG. 5) one deposits on the surface of the water 21 contained in a reservoir 22 a drop of a solution of collodion dissolved in ether. This drop spreads out over the free surface of the water 21 and forms the said membrane 20. This membrane 20 is received on the lateral surface of the metal ring 23.

As shown in FIG. 6, the ring 23 is disposed on a rotatable platform 4a in a fashion such that the membrane 20 covers the free surface of the crystal 3c which is equally disposed on the platform 4a. For the attachment of the ring 23, one provides elastic clips 24 and 25 which clamp the said ring against the surface of the platform 4a.

It will be noted that the height of the ring 23 is below that of the crystal 3c so that the membrane 20 can be applied in molecular contact against the free surface of the said crystal.

To manufacture the monocrystalline-like layer on the film 20, one proceeds as previously described especially with relation to FIG. 2. In other words, the crystal 3c is heated and on the part of the layer 20 covering the crystal 3c one deposits, at a temperature of approximately 55° C., a drop of a saturated aqueous solution of triglycine sulfate. The platform 4a is subsequently rotated around its vertical axis 5a at a speed of approximately 5000 revolutions/minute.

It has been noted that with the process described with respect to FIG. 6, one has been able to obtain, as in that described in relation to FIGS. 2 and 3, a monocrystalline layer of triglycine sulfate.

As with the embodiment of FIGS. 2 and 3, it is thought that it is the porosity of the collodion membrane which allows the growth of a monocrystalline layer from seeds constituted by the free surface of the crystal 3c.

In utilizing the apparatus appearing in FIG. 6, it has equally been observed that it was possible to deposit a monocrystalline layer of triglycine sulfate on a film of Mylar plastic material. However, as this material does not have a natural porosity, it has proven necessary to artificially puncture the holes in the film of this material. To this end, holes of a diameter of approximately 2 microns were punctured in a mesh of about 100 microns in a MYLAR membrane of about 4 micron thickness. The holes in question have been made with the aid of a laser beam (not shown) of ionized argon. On this membrane, thus punctured and applied against the surface of a triglycine sulfate crystal, it has been possible to grow a monocrystalline-like layer of the same material (TGS). One has been able to subsequently separate the film of MYLAR, covered with a monocrystalline-like layer, from crystal 3c. Thus, a monocrystalline ferroelectric film has been obtained on a plastic support.

It will be appreciated that the process that has just been described with respect to FIGS. 5 and 6 permits the inexpensive manufacture of thin monocrystalline layers. In effet, contrary to the process described with relation to FIGS. 2 and 3, the crystal 3c can be utilized as well as a crystallization support for the manufacture of a large number of such thin monocrystalline-like layers.

In addition, it will be appreciated that with the latter mode of manufacture described one can equally obtain a thin monocrystalline-like layer requiring no support. To this end, its suffices to eliminate the support of collodion or of MYLAR by selective chemical attack leaving intact the crystal of triglycine sulfate.

Until, this point only triglycine sulfate has been exemplified as constituting the thin monocrystalline-like layers. Yet, the description of this example should not be interpreted in a limiting fashion. In effect, it has been observed that the manufacturing process of thin monocrystalline layers which has been described is of totally general application. By way of example, one has been able to manufacture, besides the thin layers of triglycine sulfate, layers of triglycine selenide and fluoroberyllium triglycine; in these last two instances the monocrystal 3 was made out of triglycine sulfate. Thin layers of diacidic ammonium phosphate have also been grown. In this last instance, the intermediate layer was made out of collodion, of lead fluoride or of silver.

The invention is furthermore not limited to the process of crystallization on a revolving platform together with evaporation of a solvent as has been described hereinabove. One can use any other process of growing the flat crystals. The deposit of the material making up the monocrystalline layer can be effected in particular by gaseous methods as for example sublimation and the reaction between two gaseous products reacting to form the element to be deposited on a layer 2 (or 20).

It has been equally indicated until now that the thin monocrystalline-like layer was made out of the same material as the crystal mass. However, it is not necessary that the said crystal be made out of the same material as the thin film to be manufactured: it suffices that the crystal mass has the same structure or a structure related to that of the monocrystalline-like layer which one desires to fabricate.

The thin layers obtained by the process which has just been described, or thin layers having the same characteristics can lend themselves to numerous applications. By way of example, it would be indicated that if the said layer is made out of the pyroelectric material it can be utilized to manufacture an electromagnetic ray detector, a temperature collector and a "thermal" images receptor. It is known that the detectivity or factor of merit of a pyroelectric receptor varies inversly with the thickness of the pyroelectric crystal; but until now one was not able to manufacture such receptors except with monocrystals whose thickness was greater than about 5 micron. With the process according to the invention, one obtains thicknesses of monocrystals on the order of about 1 micron or less. The detectivity is thus significantly increased.

Certain pyroelectric crystals likewise have ferroelectric properties (spontaneous polarization can be reversed by application of an electric field). In this case, the said thin layers can be utilized to manufacture memories, i.e., devices for storing information. In this case, the thin monocrystalline-like layers according to the invention are particularly advantageous, it being a given that the quantity of information which it is possible to store per unit of surface on a ferroelectric crystal depends inversely on its thickness.

The invention is not, it should be well be understood, limited to the manufacture of thin layers having pyroelectric or ferroelectric properties. The thin layers according to the invention can be equally utilized, by an appropriate choice of material, especially for optical applications, in particular to manufacture polarizers, circulators, modulators, etc. The layers can also be utilized for integrated optic applications.

Several specific examples of manufacture according to the process of the invention will now be described with respect to FIGS. 7 to 13.

FIG. 7 illustrates an electromagnetic receptor of the pyroelectric type.

The pyroelectric receptor is located on a surface 31 of a monocrystal mass 30 of triglycine sulfate whose polar axis (arrow F) is perpendicular to the said face 31 such as is required to manufacture a pyroelectric receiver.

The receiver comprises a layer or film of an insulator 32 made out of a plastic material and punctured with openings 33. In the example, the thickness of the film 32 is on the order of about 1 micron.

On the said layer 32 is disposed a layer 34 of chromium whose resistance per square centimeter is about 10 ohms. It has been observed that with a thickness thus chosen, the layer 34 presents numerous submicroscopic holes. This layer 34 is disposed not only on the insulating layer 32 but equally in the openings 33. It is thought that it is the submicroscopic holes of the metallic layer 34 found on the surface 31 of crystal 30, in the opening 33, which permit the growth of the monocrystalline-like layer 35 of triglycine sulfate. In the example, this layer 35 has a thickness on the order of about 1 micron.

On the monocrystalline layer 35 is deposited a chromium film 36 whose thickness is chosen in such manner that its resistance per square centimeter is about 500 ohms.

Electric contacts 37 and 38 are disposed on the metallic layers, 34 and 36 respectively.

To manufacture the insulating layer 32, one can proceed as has been described above, i.e., by puncturing the holes 33 with the aid of a laser beam preliminary to application of the said layer 32. One can equally prepare a very thin film of collodion on the surface of a crystallizer containing water (FIG. 5); this collodion film has numerous submicroscopic holes.

To puncture the holes 33 in a plastic film material 32, it is equally possible to proceed by an ionic bombardment as described for example in the article of J. MARCHAND and J. R. PUIG intitled "Membranes Minces à Porosite Anisotropé" published in the Review INFORMATION CHIMIE, page 223, No. 123 (1973). The holes 33 can equally be made by mechanical piercing (by utilizing for example the needling technique known in the field of non-woven textiles) or further by the aid of an electric arc (sparking).

Alternatively, the openings 33 may be made "in situ", i.e., after the application of the insulating layer 32 on a surface 31 of the crystal 30. To this end, a drop of photosensitive plastic is spread on the surface 31. The image of a grill is then projected on the photosensitive material and this material is subjected to a photographic development.

In the case where the layer 32 is made out of collodion, it will be noted that it is equally possible to directly spread a drop of collodion solution on the surface 31 of the crystal 30.

The insulating layer 32 pierced with openings 33 can equally be prepared directly on the surface 31 by evaporation of a mixture of polymer and of a suspension of another material (for example a carbonate of controlled granulometry) followed by a selective attack of the material (an acid in the case of the carbonate). One can also evaporate a mixture of latex and of collodion and then subsequently dissolve the collodion; this latter process makes it possible to obtain openings of a diameter of about 0.2 to about $0.8\mu$.

In the example, the chromium layer 34 is deposited by evaporation under vacuum.

The layer 35 of triglycine sulfate is obtained in the manner described above in relation to FIG. 2, i.e., in particular by evaporation of a saturated solution. Alternatively, this saturated solution contains additives which are themselves known, which facilitate detection such as alanine.

It will equally be noted that with respect to layer 35, in place of TGS, one can use one of its derivatives depending on the particular application contemplated. For example, it is advantageous to use deuterated TGS for detection of rays having temperatures greater than about 40° C., or triglycine selenate (TGSe) for the detection of radiation of a temperature below about 15° C.

It has been noted that the structure illustrated in FIG. 7—comprising, on one hand, an insulating layer 32 pierced by holes 33 and, on the other hand, a metallic layer 34 having submicroscopic holes—makes it possible to obtain a thin monocrystalline layer 35 of high quality. Without desiring to limit the invention to a particular theory, it is thought that the layer 35 grows in the following fashion: there is first an epitaxial seeding in the submicroscopic holes of the layer of chromium 34 and thereafter lateral growth which results in the manufacture of the said layer 35.

The upper layer of chromium 36 is, like the layer 34, made by evaporation under vacuum. The extremely thin thickness of layer 36 makes possible the absorption of incident electromagnetic radiation at most favorable conditions.

The receptor which has just been described in relation to FIG. 7 is, by virtue of the thickness (1 micron) of the layer 35, much more sensitive than the analogous receptors presently known in which the thickness of the layer of TGS is about 100 microns. However, this elevated sensitivity is limited to the high frequencies of modulation (at least about 1000 Hertz) in the example because the thin layer 35 is connected to a crystal mass 30.

This detector may be used for the detection of all types of electromagnetic radiation, from ultraviolet to radio waves.

The applications for such a detector are numerous. By way of example, the detection of forcible entries, fires, etc., can be cited; it can also be used in applications in the domain of telecommunications as well as for the creation of optical radars based on the Doppler effect.

The pyroelectric detector illustrated in FIG. 7 is connected to a crystal mass 30. Alternatively, this detector is manufactured by a process analogous to that already described in relation to FIG. 6. It will be noted however, in this case, as represented in FIG. 8, the periphery of the layer of plastic material 32a is connected to the upper surface of a brass ring 40 without it being necessary to utilize retaining pieces such as the pieces 23 and 25. After making the various layers 32a to 36a, as has already been described with relation to FIG. 7, the detector is separated from the crystal mass (not shown in FIG. 8) and from the ring 40. In this case, this separation is performed easily by a mechanical type of separation.

Figure 10:
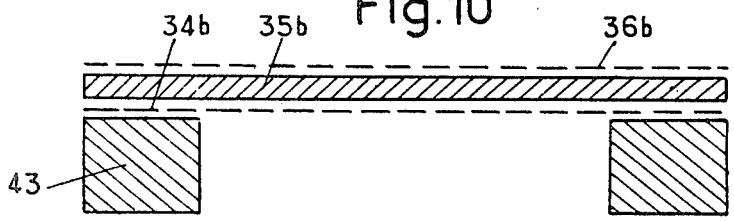
Figure 11:
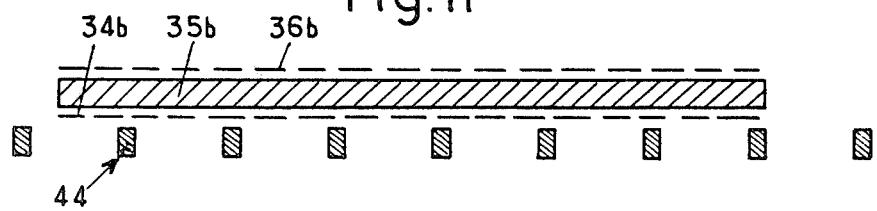
Figure 12:
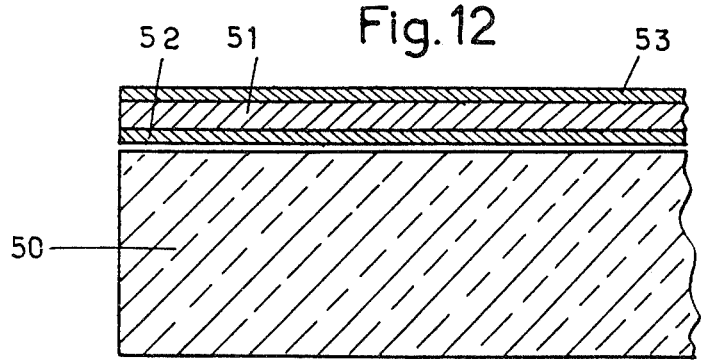
FIG. 12 illustrates a structure having a thin monocrystalline layer made out of a semiconductor material and disposed on a glass support.
Figure 13:
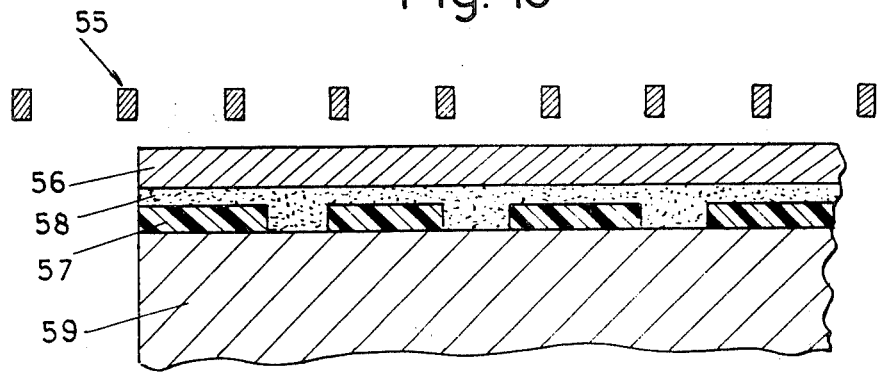
FIG. 13 shows a step of a process according to the invention of manufacturing a monocrystalline layer out of tellurium.

FIGS. 9 to 11 illustrate another process permitting the separation from the crystal 30 of the article formed by the layer 35 of TGS and the metallic layers 34 and 36.

To this end, the crystal 30 covered by the layers 32 to 36 is immersed in crystallizer 41 containing an organic solvent 42 which is selected so that it can dissolve the insulating layer 32. For example, if the layer 32 is made out of collodion, anyle acetate solvent may be used.

As in the process represented in FIG. 5, the detector formed by the layers 34b, 35b and 36b is subsequently taken out of the crystalliser 41 with the aid of a brass ring 43 (FIG. 10). The detector thus obtained is fragile. It is thus preferable to place it in a container void of air (not shown).

The detector formed by the layers 34b, 35b and 36b (FIG. 9) can subsequently be deposited on a plastic film of small thickness which is metallicized on one of its surfaces. Finally, as illustrated in FIG. 11, the said layers 34b, 35b and 36b can equally be deposited on a metallic grid 44 (for example of copper).

The grid 44 will have a mesh having high transparency for the electromagnetic radiation to be detected; this grid 44 is manufactured, in the example, by a photoengraving process. Alternatively, there may be no lower metallic layer 34b since the grid 44 forms the electrode.

A pyroelectric receiver separated from the crystal mass has an elevated sensitivity for all frequencies of modulation. The detectivity (D*) of such a receptor is, at low frequency, at least equal to that of the thermal receptors presently known. For the elevated frequencies, for example above about 5 Hz, the detectivity of such a pyroelectric receptor is significantly greater than that of the known thermal detectors.

The process according to the invention is equally useful for the manufacture of thin monocrystalline-like layers of semi-conductor materials such as cadmium sulphide CdS, cadmium selenide CdSe, or cadmium telluride CdTe. To fabricate such a monocrystalline-like layer, one can use a process analogous to that described in relation to FIG. 7. In other words, on the surface of a semi-conductor crystal such as cadmium sulphide, one deposits a layer of plastic material which has been pierced (prior to or in situ) with openings, a layer of chromium, a layer of cadmium sulphide and finally a layer of chromium.

Yet, it must be noted that, in general, the semiconductor will be deposited in the vapor phase while the TGS will be fabricated from a solution. To this end, when using the known vapor phase transport techniques, the temperature of the crucible in which the body of the semi-conductor is deposited, the nature of the transport gas and the state of the crystal mass (forming matrix) are each determinable within the present state of the art.

As in the case of TGS, a thin layer of cadmium sulphide can be separated from the crystal mass by dissolution of the layer of plastic material in an organic solvent. This thin monocrystalline layer is, optionally, enclosed or not enclosed with metallic layers forming electrodes.

A monocrystalline-like layer of cadmium sulphide a thickness of 3 microns is sufficiently resistent to be used without support. However, for certain applications, it may be useful to deposit this layer on a support mass, for example a glass support 50 shown in FIG. 12. In the example illustrated in this last figure, the monocrystalline-like layer 51 of cadmium sulphide is covered over its lower face by a metallic film 52 and over its upper face by a metallic film 53. This layer 53 may, alternatively, be replaced by a grid (not shown).

Experiments conducted within the framework of the invention have shown that the process of the invention may be used to make thin monocrystalline-like layers of tellurium Te. This latter material is a semi-conductor, as are CdS, CdSe and CdTe, already cited. In one particular experiment, a thin layer of tellurium is manufactured by separation from a crystalline mass of tellurium, this tellurium crystal having a face which is cleaved parallel to the hexagonal axis. In the course of this experiment a structure was obtained analogous to that shown in FIG. 7. However, as in the case of CdS, CdSe and CdTe, the thin layer of tellurium was prepared by a vapor phase transport process.

The film of tellurium can be detached by dissolving the plastic film in an organic solvent. With small thicknesses, on the order of 0.1 micron, it is not necessary to take any special precautions. However, for greater thicknesses, on the order of a micron, the film of tellurium tends to roll-up on itself after the dissolution of the film of plastic material. To avoid this deformation, a copper grid 55 is disposed above the layer 56 of tellurium, at a distance on a order of about several tenths of a millimeter. When the layer 57 of plastic material has been dissolved, the film 56 whose lower face is covered by a chromium layer 58 (of a square resistance of about 10 ohms), detaches itself from the monocrystalline mass 59 of tellurium and thus adheres to the grid 55; the layer 56 thus remains planar. For the detection applications, it is preferable that the grid 55 have an elevated transmission for the electromagnetic radiation to be detected.

Figure 14:
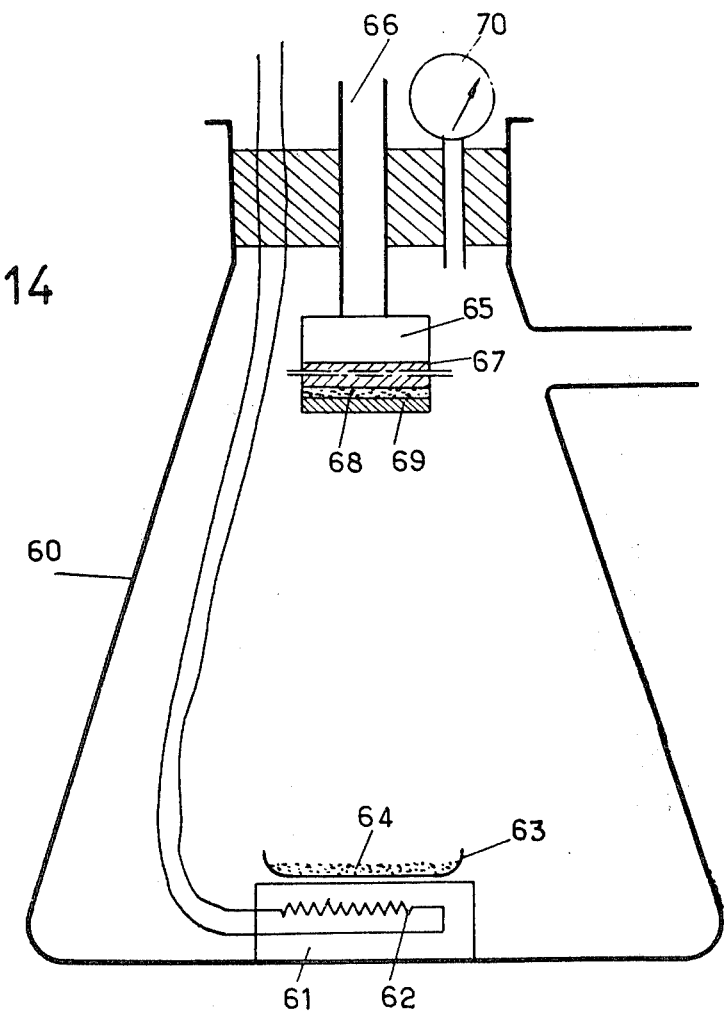
FIG. 14 represents an apparatus for use in the manufacture of thin monocrystalline layers of benzoic acid.

FIG. 14 illustrates a process of preparing a thin monocrystalline layer of benzoic acid.

At the lower part of a container 60 connected to pump means (not shown), one places a support 61 made up by a block of copper on the interior of which is located a resistance heater 62. On the block 61 is installed a scoop 63 filled with benzoic acid 64 in powder form.

At the upper part of the container 60 is disposed a second block of copper 65 connected to cooling means (not shown) by means of piping 66. These cooling means permit the cooling of the block 65 to a temperature on the order of 10° C.

A monocrystalline mass 67 covered on its lower face by a silver film 68 of a resistance per square centimeter on the order of about 0.1 ohm is attached on the lower face of the block 65. The face of the crystal 67 on which is disposed the metallic layer 68 is parallel to the monoclinic axis of the said crystal.

The thin monocrystalline-like layer 69 of benzoic acid is made by transport in the vapor phase at a pressure—measured by a manometer 70—on the order of 5 Torrs. In this case, it is not necessary to use a transport gas by virtue of the elevated sublimation pressure of the benzoic acid.

Birefringences measurements have shown that the orientation of the layer 69 is everywhere parallel to that of the monocrystal 67.

Alternatively, the crystal 67 is covered by a MYLAR film having a thickness of about 4 microns pierced with holes on which the layer 69 is deposited as described hereinabove. It must however be noted here that with the same experimental conditions, i.e., a pressure of about 5 Torrs, a first attempt succeeded not in obtaining a continuous monocrystalline-like layer but instead in a group of separate monocrystals each having the same orientation.

The thin monocrystalline-like layers made out of semi-conductor materials lend themselves to numerous applications. These layers can especially be used for photoelectric and photocell receptors. These thin semi-conductor monocrystalline layers can be doped and thus permit the manufacture of PN junctions. To this end, one may vary the temperature of the crystal support, the temperature of the scoops containing the constituents to be evaporated (the semi-conductor monocrystalline films being prepared by the gaseous method), the nature and the temperature of the transfer or transport gas.

With the process of the invention and when using semi-conductor materials such as cadmium telluride, gallium arsenide or silicon arsenide, it is possible to make photocells at a reduced cost thus permitting, for example, the conversion of solar energy into electric energy under economical conditions.

An important advantage of the process of the invention resides in the fact that one obtains monocrystalline-like layers under economical manufacturing conditions.

The drawings and specification present a detailed disclosure of preferred embodiments of the invention, yet it is to be understood that the invention is not limited to the specific forms and methods disclosed, but covers all modifications, changes and alternative constructions and methods, falling within the scope of the invention as defined by the claims.

I claim:

1. Article comprising:
   a first layer in contact with a face of a monocrystalline support, said first layer being made out of a second material which is different from the material constituting the support, said first layer comprising openings of small cross-section;
   a second layer made out of a third material different from the support material and from the second material, said second layer being in contact with said first layer and with the parts of the monocrystalline support aligned with the openings in the said first layer, said second layer being of small thickness controlled within limits and having openings of small cross-section therein because of its thickness; and
   a thin monocrystalline-like layer being disposed on said second layer, said thin monocrystalline-like layer being made out of a given material which is the same as or has a structure which is the same as or related to that of the support material.

2. The article of claim 1 wherein said second layer comprises submicroscopic openings.

3. Process of growing a thin monocrystalline-like layer of a given material which comprises:
   depositing an intermediary layer having two superposed parts on a monocrystalline support made out of the said given material or out of a material having same or a related structure, said parts of this intermediary layer being made out of different materials which differ from the given material, the first of these parts being directly in contact with the support and having openings of small cross-section distributed over its surface, and the second part covering the first part and having a small thickness controlled within limits and presenting, because of its thickness, submicroscopic openings at least in front of the openings of the first part, and growing said thin monocrystalline-like layer on said intermediary layer.

4. Process of claim 3, wherein the material of the first part of the intermediary layer is an insulator and the material of the second part is a metal.

5. Process of claim 4, wherein the insulator is a plastic material.

6. Process of claim 4, wherein the metal is chromium.

7. Process of claim 6, wherein the resistance of the chromium per square centimeter is about 500 ohms.

8. Process of claim 4, wherein the insulator material is a photosensitive material, and in that the openings of small cross-section are made in the insulator material by photoengraving, prior to the growth of the thin monocrystalline-like layer.

9. Process of claim 8, wherein said thin monocrystalline-like layer and said metal part are separated from the monocrystalline support by dissolution of the insulator material.

10. Process of claim 9, wherein the insulator material comprises collidium wherein it is dissolved by an amyl acetate solution.

11. Process of claim 4, wherein the insulator is in the form of a plastic film and is applied mechanically to the face of the monocrystalline support after the creation of the openings of small cross-section within said film, said plastic film covering the monocrystalline support being separated from said support after the fabrication of said thin monocrystalline-like layer.

12. Process of claim 11, wherein the said openings of small cross-section are made by concentrating a laser beam on selected locations on the plastic film.

* * * * *